United States Patent
Buller et al.

(10) Patent No.: US 9,508,874 B2
(45) Date of Patent: Nov. 29, 2016

(54) PHOTOVOLTAIC DEVICE AND METHOD OF MANUFACTURE

(71) Applicant: FIRST SOLAR, INC., Perrysburg, OH (US)

(72) Inventors: Benyamin Buller, Sylvania, OH (US); Chungho Lee, San Jose, CA (US); Rui Shao, Sylvania, OH (US); Gang Xiong, Santa Clara, CA (US); Zhibo Zhao, Novi, MI (US)

(73) Assignee: FIRST SOLAR, INC., Perrysburg, OH (US)

( * ) Notice: Subject to any disclaimer, the term of this patent is extended or adjusted under 35 U.S.C. 154(b) by 647 days.

(21) Appl. No.: 13/790,645

(22) Filed: Mar. 8, 2013

(65) Prior Publication Data

US 2013/0233380 A1 Sep. 12, 2013

Related U.S. Application Data

(60) Provisional application No. 61/608,918, filed on Mar. 9, 2012.

(51) Int. Cl.
| | |
|---|---|
| H01L 31/00 | (2006.01) |
| H01L 31/0216 | (2014.01) |
| H01L 31/0445 | (2014.01) |
| H01L 31/073 | (2012.01) |
| H01L 31/0749 | (2012.01) |
| H01L 31/0224 | (2006.01) |

(52) U.S. Cl.
CPC . *H01L 31/02167* (2013.01); *H01L 31/022466* (2013.01); *H01L 31/0445* (2014.12); *H01L 31/073* (2013.01); *H01L 31/0749* (2013.01); *Y02E 10/541* (2013.01); *Y02E 10/543* (2013.01)

(58) Field of Classification Search
CPC .................................................. H01L 31/0445
See application file for complete search history.

(56) References Cited

U.S. PATENT DOCUMENTS

| | | | |
|---|---|---|---|
| 4,388,483 A | 6/1983 | Basol et al. | |
| 4,568,578 A * | 2/1986 | Arfsten | C03C 17/27 427/108 |
| 5,230,746 A * | 7/1993 | Wiedeman | H01L 31/075 136/249 |
| 2005/0284518 A1 | 12/2005 | Yamada et al. | |
| 2008/0251119 A1 | 10/2008 | Forehand | |
| 2009/0314341 A1* | 12/2009 | Borden | H01L 31/022441 136/256 |
| 2010/0186802 A1* | 7/2010 | Borden | H01L 31/0236 136/255 |
| 2010/0186808 A1* | 7/2010 | Borden | H01L 31/022425 136/256 |
| 2011/0162706 A1* | 7/2011 | Borden | H01L 31/03682 136/256 |
| 2011/0308584 A1 | 12/2011 | Joshi et al. | |
| 2015/0236177 A1* | 8/2015 | Fu | H01L 31/035209 136/255 |

FOREIGN PATENT DOCUMENTS

| | | |
|---|---|---|
| DE | 100 10 177 A1 | 9/2000 |
| EP | 2 387 079 A2 | 11/2011 |
| WO | WO 2009/006910 A2 | 1/2009 |

* cited by examiner

*Primary Examiner* — Evan Pert
(74) *Attorney, Agent, or Firm* — Blank Rome LLP (57) ABSTRACT

A photovoltaic module including a dielectric tunneling layer and methods of forming a photovoltaic module with a dielectric tunneling layer.

27 Claims, 9 Drawing Sheets

PHOTOVOLTAIC DEVICE AND METHOD OF MANUFACTURE

CLAIM OF PRIORITY

This application claims priority under 35 U.S.C. §119(e) to U.S. Provisional Patent Application Ser. No. 61/608,918 filed on Mar. 9, 2012, which is hereby incorporated by reference in its entirety.

TECHNICAL FIELD

This disclosure relates to photovoltaic devices with tunneling layers and methods for manufacturing photovoltaic devices with tunneling layers.

BACKGROUND

As used herein, the term tunneling refers to a quantum mechanical phenomenon where a sub-atomic particle, e.g., an electron, tunnels through a barrier, e.g., a classically forbidden energy state, that it classically could not surmount. A simple tunneling barrier can be created by separating two conductors with a very thin insulator. This can be represented in a semiconductor device by an electron tunneling from a semiconductor material through a dielectric material, which represents the energy barrier, to a conductive material on the other side. Even if the energy barrier presented by the dielectric material is higher than the electron energy, there is quantum-mechanically a finite probability of this transition through the dielectric layer.

Thus, a tunneling layer provides a physical barrier to particles, but not an electrical barrier to sub-atomic electrons and electrical current. Such a tunneling layer will not increase resistance in an electrical device because electrons do not need to overcome an energy barrier to pass the tunneling layer. However, such a tunneling layer can be a physical barrier to the movement of particles larger than electrons, e.g., atoms or ions.

In any event, a photovoltaic (PV) device is a device that can convert photo-radiation into electrical current. A typical PV device includes two conductive electrodes sandwiching a series of semiconductor layers, which provide a junction at which photoconversion occurs. During operation, photons pass through the PV device layers and are absorbed at or near the junction. This produces photo-generated electron-hole pairs, the movement of which, promoted by a built-in electric field, produces electric current that can be output from the device. A PV device can be a PV cell, PV module, etc. A PV module is made of a plurality of connected PV cells.

PV modules can be formed on an optically transparent substrate of any suitable, transparent substrate material. Suitable materials include, for example, glass, such as soda-lime glass or float glass, etc., and polymer (sheet or plates). A first of the two conductive electrodes is provided over the transparent substrate. The first conductive electrode can be a transparent conductive oxide (TCO) layer (e.g., indium tin oxide). The TCO layer can also be associated with a barrier layer, which can be conductive, between it and the transparent substrate and a conductive oxide buffer layer over the TCO layer, which together provide a conductive TCO stack that functions as the first conductive electrode. Over the first conductive electrode (e.g., over the buffer layer if provided) a semiconductor layer can be provided. The semiconductor layer can be a bi-layer that includes a semiconductor window layer (e.g., cadmium sulfide) and a semiconductor absorber layer (e.g., cadmium telluride). Over the semiconductor layer, the second of the two conductive electrodes can be a back contact layer. A back cover can be provided over the back contact layer to provide support for the PV module. An interlayer can be provided between the back contact layer and the back cover and over the sides of the other layers of the PV module to seal the PV module from the environment.

Efficiency, stability, and reliability in PV module performance are always goals in PV module manufacturing. These depend at least in part on materials used in the component layers of the PV module, the position of each layer relative to each other, and the thickness of each layer. For example, one way a PV module can be made more efficient is by thinning the window layer because the materials commonly used for this component (e.g., CdS) are fairly light absorbent, particularly to blue wavelength light. A thinner window layer can allow more light to be transmitted to the absorber layer, thereby allowing more photoconversion of electricity. However, in making the window thinner problems can occur, such as having missing portions of the window layer material where the underlying conductive TCO stack may come into direct electrical contact with the absorber layer. This electrical contact between the absorber layer and TCO stack could cause the PV module to malfunction. For example, electrical shunting (a conductive path through an otherwise non-conducting layer) or shorting (unwanted direct electrical contact between materials) between the absorber and conductive TCO stack could be exhibited, which can make the PV device unstable.

Furthermore, during field operation of a PV module, it is possible for the materials of some layers within the module to migrate to other layers within the PV module under the influence of the electrical current caused by photoconversion. For example, $Mg^{2+}$, $Na^+$, and/or $Ca^{2+}$ ions from the glass substrate of the PV module could migrate to the absorber layer, which could significantly degrade the performance of the PV module by changing the electrical characteristics of the absorber layer or making it sensitive to moisture.

A PV module structure which mitigates against such shorting/shunting and particle migration problems is desired.

DETAILED DESCRIPTION

Figure 1:
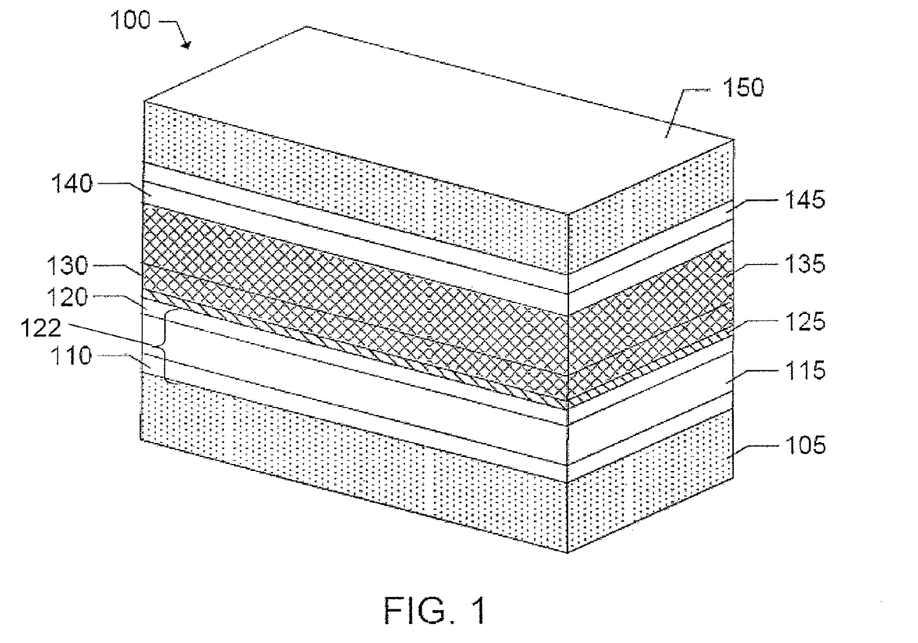
FIG. 1 is a perspective view of a portion of a PV module.

Referring to the figures, which use like reference numbers to denote like features, FIG. 1 shows an exemplary embodiment of a PV module 100. As noted above, the PV module 100 includes a substrate layer 105, a barrier layer 110, a TCO layer 115, a buffer layer 120, a window layer 130, an absorber layer 135, a back contact layer 140, an interlayer 145, and a back cover 150. These layers can be serially deposited. Due to particle mobility (i.e., movement of atoms and ions between the layers of the PV module 100) and the proximity of different materials in the layers of the PV module 100 to one another, electrical characteristics of the layers can degrade over time as atoms and ions move from their original layers to layers where they were not intended to be.

During the PV module 100 fabrication steps involving thermal activations and also during field use of the PV module 100 when an electric current is present, migration of mobile particles, such as ions or atoms, is possible. During PV module 100 fabrication, the device may be annealed, which can cause particles, e.g., ions in the glass layer 105, to move among the layers of the PV module 100. During field use of the PV module 100, light exposure produces current and an electrical field within the module 100, which can also cause the migration of ions, such as $Mg^{2+}$, $Na^+$ and/or $Ca^{2+}$ ions from the glass layer 105 or $Cu^{2+}$ ions from the window layer 130, into other layers of the PV module 100, e.g., the absorber layer 135. Such movement of ionic or atomic particles in the module 100 is undesirable because it can change chemical and electrical properties of the layers from which the particles originate and, particularly, of the layers to which the particles move. This can degrade the functioning of the PV device.

Reliability of the PV module 100 often depends on the condition of the absorber layer 135, which can change over time during field use of the PV module 100 if, e.g., particles from the glass layer 105 migrate to the absorber layer 135. For example, the absorber layer 135 typically has a threshold for sodium ion ($Na^+$) concentration of about $10^{18}/cm^3$. Above this threshold, performance of the PV module 100 degrades because the absorber layer 135 (preferably CdTe material) becomes more sensitive to moisture. Because during field use the PV module 100 is exposed to moisture, such sensitivity can make the PV module 100 less reliable. Preventing or reducing the movement of such ions to the absorber layer 135 can, thus, improve the PV module 100 reliability. Stability of the PV module 100 can similarly degrade over time because of such movement of conductive particles between the layers of the module 100.

To improve performance, reliability, and stability of the PV module 100, a tunneling layer 125 is provided. In the exemplary embodiment shown in FIG. 1, the tunneling layer 125 is positioned between the buffer layer 120 of the TCO stack 122 and the semiconductor window layer 130. The tunneling layer 125 can maintain the desired material make-up and associated electrical properties of the layers of the PV module 100. In this way, the tunneling layer 125 acts as a barrier to migration of such mobile particles and can improve the stability (the long term maintenance of performance characteristics) and reliability (continued expected performance) of the PV module 100. Providing the tunneling layer 125 as a physical barrier to such particle movement can help maintain the condition of the module 100 as it was immediately after manufacture, thereby improving the stability of the PV module 100.

As explained above, the tunneling layer 125 does not present an electrical barrier between the TCO layer 115 of the TCO stack 122, which is an electrode of the PV module 100, and the absorber layer 135 and is essentially electrically invisible to current, so it does not negatively effect the performance of the PV module 100. The inclusion of the tunneling layer 125 also allows the window layer 130 to be thinner without concern about the potential for unwanted electrical contact between the absorber layer 135 and the TCO stack 122, thereby improving PV module 100 performance as discussed above. Further, providing the tunneling layer 125 between the window 130 and buffer layer 120 helps to maintain the desired interfacial chemistry and reduce interfacial states of these layers at their boundary.

The tunneling layer 125 can be an ultra thin dielectric layer positioned anywhere between the TCO layer 115 and the semiconductor absorber layer 135. As explained below, the precise positioning of the tunneling layer 125 between the TCO layer 115 and the semiconductor absorber layer 135 depends on the effects desired that the tunneling layer can provide.

As mentioned above, electrons can pass between the absorber layer 135 and the TCO layer 115 through the tunneling layer 125 with little resistance by direct tunneling. Therefore, electrons from the conduction band (the range of electron energies, higher than that of the valence band where atom-bound electrons are found, sufficient to free an electron from binding with its individual atom and allow it to move freely within the atomic lattice of the material) in the semiconductor-based material of the absorber layer 135 can transfer across the tunneling layer 125 directly (i.e. without changing energy) into the conduction band of the conductive material of the TCO stack 122. The tunneling layer 125 is effectively electrically invisible to current within the PV module 100. The tunneling layer 125 can be composed of a variety of materials such as, for example, transparent oxides or nitrides, but is preferably one or a combination of two or more of silicon oxide, silicon nitride, silicon oxynitride, tantalum pentoxide, hafnium oxide, zirconium oxide, and aluminum oxide.

The tunneling layer 125 can be of a variety of thicknesses, but is preferably between about 1 Å (angstroms; 1 angstrom=0.1 nanometers) to about 300 Å thick, and more preferably is between about 5 Å and 60 Å thick. The thickness of the tunneling layer 125 can optionally depend in part on the materials in the absorber layer 135 of the PV module 100. Typically, an absorber layer 135 is doped with chlorine (e.g., using $CdCl_2$) to activate the layer. A more heavy chlorine doping of the absorber layer 135 can cause fluxing (secondary growth and flow) of the associated window layer material (CdS), causing it can be absent in areas between the absorber 135 and TCO stack 122. In such a case, the tunneling layer 125 can and should be thicker, within the above-identified thickness range, to provide separation between the absorber 125 and TCO stack 122 to compensate for the potentially absent window layer material.

The inclusion of the tunneling layer 125 in the PV module 100 can mitigate the effects that direct electrical shunting and shorting have on performance and reliability of the PV module 100, e.g., where areas of the TCO stack 122 and the semiconductor absorber layer 135 would otherwise come into electrical contact because of defects in the semiconductor window 130 where it is too thin or missing. This is an issue even where the TCO stack 122 includes a buffer layer 120 because the buffer layer 120 is conductive. Even though the tunneling layer 125 allows electrons to pass therethrough and is, therefore electrically invisible in teens of current, the dielectric nature of the tunneling layer 125 provides an insulating advantage in terms of controlling shorting and shunting between the TCO stack 122 and absorber layer 135.

The tunneling layer 125 can also improve interfacial chemistry and reduce the loss of current due to recombination (electrons occupy the empty state associated with a hole) at interfacial defect states (which can provide electron traps) of the PV module 100. The interfaces of most interest are those between the semiconductor absorber layer 135 and window layer 130, and between the window layer 130 and the TCO stack 122. Interfacial chemistry refers to the chemical make-up and related properties of adjacent layers at their interface and the differences between the adjacent layers on either side of the interface. Interface defect states refers to the differences in energy levels between the conductor and valence bands of the materials on either side of a layer interface, e.g., the window 130 and absorber 135 interface, caused by material irregularities and defects in the layers at the interface.

The tunneling layer 125 is particularly beneficial to a PV module 100 having a CdTe based semiconductor absorber layer 135 and a very thin CdS based semiconductor window layer 130; however, it also can be utilized in PV modules 100 based on other materials, e.g., CIGS-based absorber layer.

Figure 2:
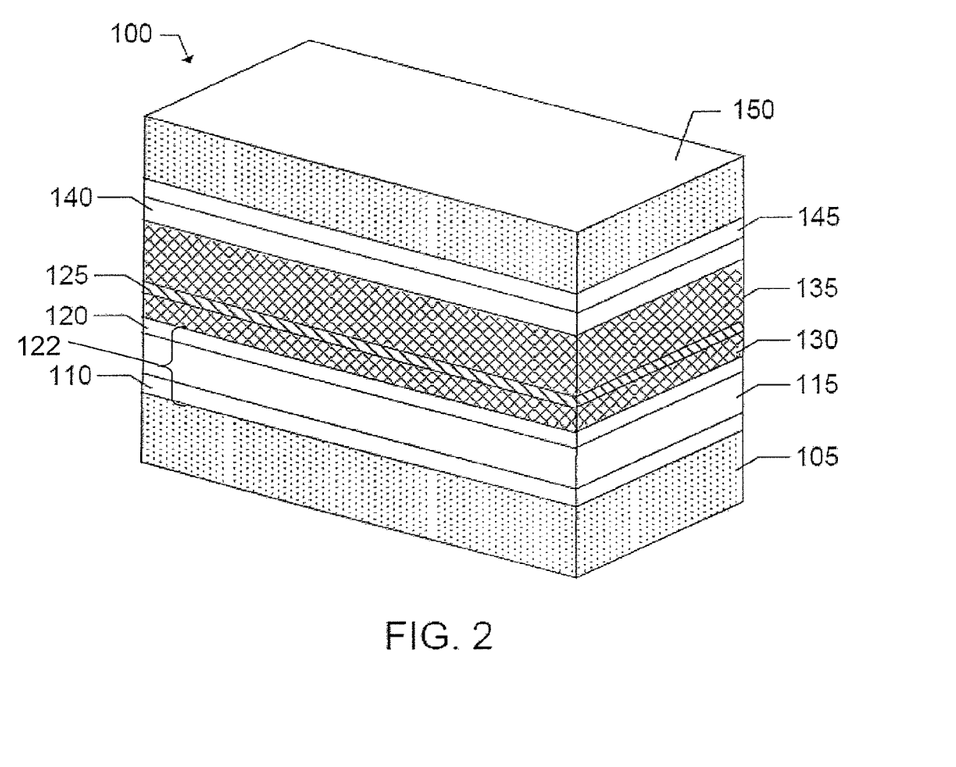
FIG. 2 is a perspective view of a portion of a PV module.

In the alternative exemplary embodiment shown in FIG. 2, a PV module 100 is shown having similar layers to the structure shown in FIG. 1. In the PV module 100 of FIG. 2, the tunneling layer 125 is positioned between the window layer 130 and the absorber layer 135. Similar to the embodiment shown in FIG. 1, the tunneling layer 125 of FIG. 2 provides a physical barrier, which helps reduce the movement of particles, e.g., from the substrate 105 to the absorber layer 135, in the PV module 100. As also explained above, the tunneling layer 125 does not present an electrical barrier between the TCO layer 115 and the absorber layer 135 and is essentially electrically invisible to current. The inclusion of the tunneling layer 125 at this location also allows the window layer 130 to be thinner without concerns for potential unwanted electrical contacts between the absorber layer 135 and the TCO stack 122 in cases where the window layer 130 is so thin as to allow discontinuities to exist therein.

Although the tunneling layer 125 of the PV module 100 shown in FIG. 2 is positioned at the P—N junction between the window 130 and absorber 135 layers, it does not impede photoconversion at the junction because the tunneling layer 125 is very thin and is not an electrical barrier to electron flow because of the tunneling phenomena. Therefore, there is still electrical communication between the window layer 130 and absorber layer 135 so as to provide a P—N junction. Further, providing the tunneling layer 125 between the window 130 and absorber 135 helps to maintain the desired interfacial chemistry (the chemical make up of the materials on either side of the interface) and reduce interfacial states (caused by defects and grain boundaries) of these layers at their boundary.

Figure 3:
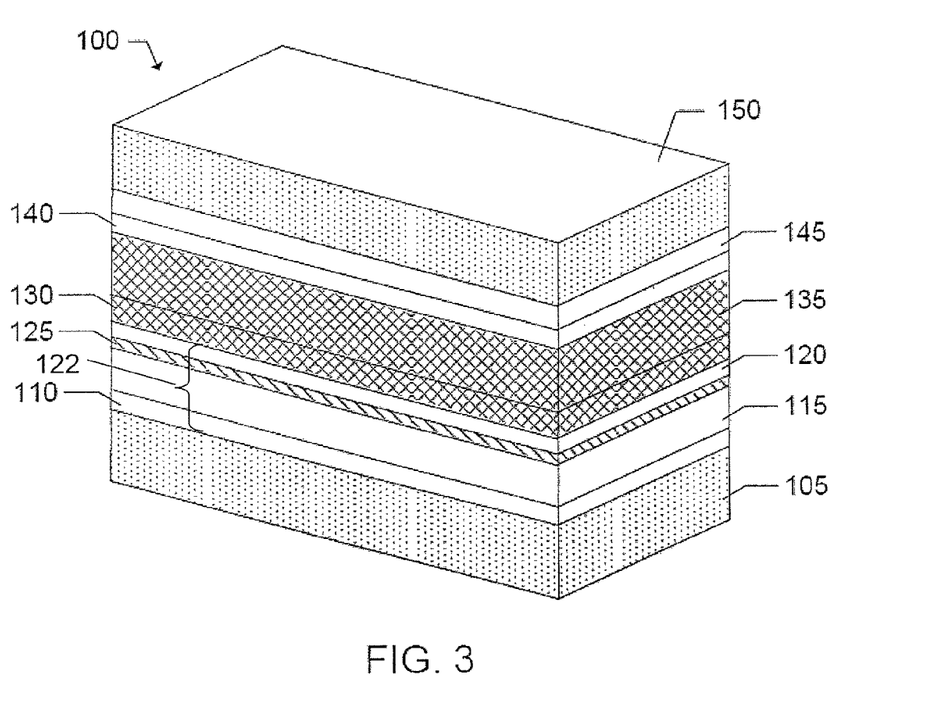
FIG. 3 is a perspective view of a portion of a PV module.

In the alternative exemplary embodiment shown in FIG. 3, which has similar layers to the structure shown in FIG. 1, the tunneling layer 125 is positioned within the TCO stack 122, between the buffer layer 120 and the TCO layer 115. While, in this embodiment, the tunneling layer 125 is not between all parts of the TCO stack 122 and the semiconductor absorber layer 135 of the PV module 100, it still provides a particle barrier preventing mobile particle migration into the absorber layer 135, e.g., from the glass substrate 105, while allowing flow of electrical current between the TCO layer 115 of the TCO stack 122 and the absorber layer 135. The embodiments shown in FIGS. 1-3 are examples and are not intended to limit the possible positions of the tunneling layer 125 within the PV module 100.

Figure 8:
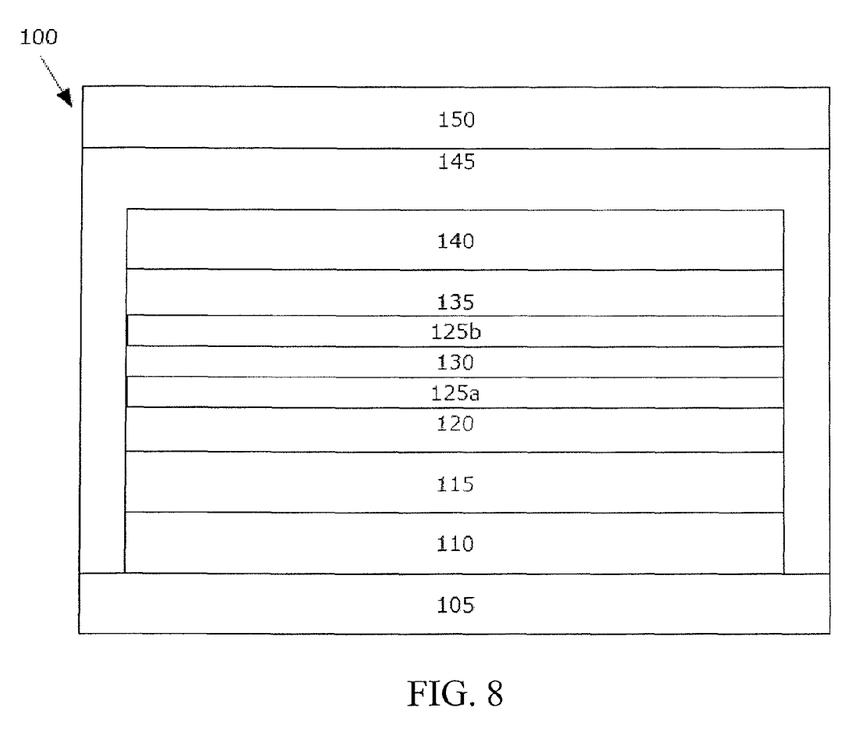
FIG. 8 shows a PV module with multiple tunneling layers.
Figure 9:
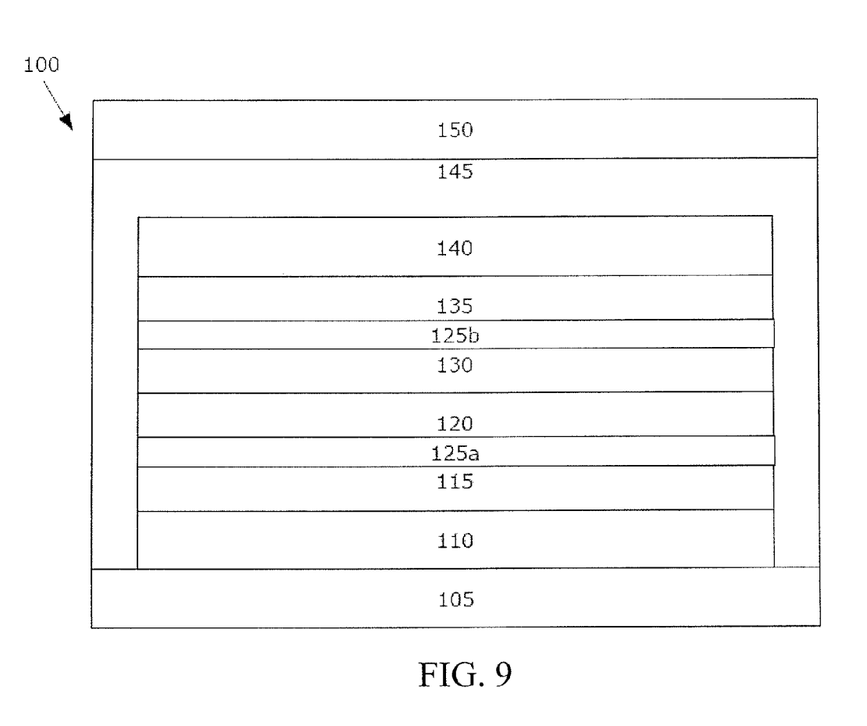
FIG. 9 shows a PV module with multiple tunneling layers.

In further exemplary embodiments, multiple tunneling layers can be provided in any suitable position in a photovoltaic module 100. For example, FIG. 8 shows a first tunneling layer 125 formed between the buffer layer 120 and the window layer 130, and a second tunneling layer 125*b* between the window layer 130 and the absorber layer 135. This combines the structures and advantages of FIGS. 1 and 2, discussed above. Also, FIG. 9 shows a first tunneling layer 125*a* between the TCO layer 115 and the buffer layer 120, and a second tunneling layer 125*b* between the window layer 130 and the absorber layer 135. This combines the structures and advantages of FIGS. 2 and 3, discussed above. These are examples of multi-tunneling-layer PV modules and are not limiting.

As indicated above with reference to FIGS. 1-3, 8, and 9, the tunneling layer 125 (125*a*, 125*b*) does not degrade the performance of the PV module 100. When used as shown in the FIGS. 1, 2, 8, and 9 embodiments, the tunneling layer 125 (125*a*, 125*b*) also allows the thickness of the window layer 130 to be reduced, thereby increasing the efficiency of the PV module 100 by allowing more light to reach the absorber layer 135. Notably, with the addition of the tunneling layer 125 (125*a*, 125*b*) to the PV module 100, a preferred semiconductor window layer 130 including cadmium sulfide (CdS) can be as thin as about 50 Å to about 1000 Å, which is at least about 50% thinner and up to about 99.9% thinner than the typical thickness of a CdS window layer (e.g., about 100-5000 Å) used in standard PV modules. It is believed that the window layer could even be eliminated or nearly eliminated if, for example a tunneling layer 125 (125*a*, 125*b*) of $SnO_2$ of the preferred thickness (about 1-300 Å) is utilized as in the exemplary embodiments of FIGS. 1-3, 8, and 9. Consequently, the efficiency of the module 100 can be increased by this thinning or elimination of the window layer 130. The associated semiconductor absorber layer 135 can be cadmium telluride (CdTe), copper indium gallium (di)selenide (CIGS), or another suitable PV semiconductor.

As discussed above, because the tunneling layer 125 (125*a*, 125*b*) can provide a physical barrier (and does not present an electrical current barrier), it can prevent or reduce ion and atomic particle transport during operation of the PV module 100. By doing so, the tunneling layer 125 (125*a*, 125*b*) can improve the stability and reliability of the PV module 100 by preventing doping profiles within the PV module 100 semiconductor layers (e.g. layers 130 and 135) from changing over time due to migration of ions or atoms. In one example, the tunneling layer 125 (125*a*, 125*b*) can prevent diffusion of copper atoms, which can originate from a CIGS-based absorber layer (e.g., layer 135), a $Cu^+$ doped CdS-based window layer (e.g., layer 130), or the back contact (e.g., layer 140), to other layers of the PV module 100 on the opposite side of the tunneling layer 125 (125*a*, 125*b*) and, thus, change the electrical properties of the destination layer. As another example, the tunneling layer 125 (125*a*, 125*b*) can prevent the migration of sodium ions from the substrate (e.g., layer 105) to the absorber (e.g., layer 135) on the opposite side of the tunneling layer 125 (125*a*, 125*b*). As a result, the tunneling layer 125 (125*a*, 125*b*) can preserve the initial doping profile of the PV module's layers and may thereby maintain the PV module 100 efficiency and stability during use.

The tunneling layer 125 (125*a*, 125*b*) of the exemplary embodiments shown in FIGS. 1-3, 8, and 9 can include silicon oxide ($SiO_x$), silicon nitride ($Si_3N_4$), silicon oxynitride ($SiO_xN_y$), tantalum pentoxide ($Ta_2O_5$), hafnium oxide ($HfO_2$), zirconium oxide ($ZrO_2$), aluminum oxide ($Al_2O_3$), or combinations thereof. The tunneling layer 125 (125*a*, 125*b*) can be formed through any suitable process such as, for example, evaporation deposition, DC pulsed sputtering, RF sputtering, AC sputtering, sputtering using a ceramic or metallic target, physical vapor deposition (PVD), atomic layer deposition, laser ablation, chemical vapor deposition (CVD), plasma enhanced chemical vapor deposition (PECVD), metalorganic chemical vapor deposition (MOCVD), atmospheric pressure chemical vapor deposition (APCVD), close-spaced sublimation, electrodeposition, screen printing, chemical bath deposition, vapor transport deposition, or other suitable techniques.

Generally, the layers and materials of the exemplary PV modules 100 shown in FIGS. 1-3, 8, an 9 can be provided as follows. The glass substrate 105 of the PV modules 100 is an optically transparent substrate and can include an optically transparent material such as soda-lime glass (most common and least expensive form of glass, which usually contains 60-75% silica, 12-18% soda, 5-12% lime), solar float glass (a set of standard to high-transmittance soda-lime float glass), low iron glass (extremely clear glass with a minimal green cast), or borosilicate glass (silicate glass having at least 5% of boric oxide in its composition).

Cadmium stannate ($Cd_2SnO_4$, CTO) can function well as a TCO layer 115 material, because it exhibits high optical transmission and low electrical sheet resistance (the measure of a sheet's opposition to electric current). Other preferred materials for the TCO layer 115 include a fluorine-doped tin oxide (F—$SnO_2$) based material; in such a case, the tunneling layer 125 can be provided over the TCO layer 115 (e.g., FIGS. 3 and 9). The TCO layer 115 can also be a cadmium stearate (CdSt) based material; if so, the TCO stack 122 can be annealed to achieve optimum TCO characteristics, e.g., high conductivity and low optical absorption, for a front contact. The TCO layer 115 can also be a cadmium tin (CdSn) based material, indium tin oxide (ITO) based material, cadmium indium oxide (CIO) based material, aluminum zinc oxide (AZO) based material, or other TCO materials. When used with the tunneling layer 125 (125a, 125b), the TCO layer 115 can be about 500 Å to about 2000 Å thick.

The barrier layer 110, which can be provided as a part of the TCO stack 122 and in association with the TCO layer 115, can be silicon oxide ($SiO_2$), silicon aluminum oxide (Si/$Al_2O_3$), tin oxide ($SnO_2$), or combinations of these or other materials. The barrier layer 110 can be about 100 Å to about 3000 Å thick.

The buffer layer 120, which can be deposited between the TCO layer 115 and the semiconductor window layer 130, can include conductive oxides, such as tin oxide ($SnO_2$), zinc oxide (ZnO), indium oxide ($In_2O_3$), zinc tin oxide (ZnO:$SnO_2$), or other transparent conducting oxides. The buffer layer 120 can be from about 50 Å to about 2000 Å thick and is preferably about 200 Å to about 1000 Å thick.

The semiconductor window layer 130 is preferably an n-type semiconductor material. The semiconductor window layer 130 can include a thin layer of cadmium sulfide (CdS), for example, about 50 Å to about 1500 Å thick and, preferably, about 200 Å to about 1000 Å thick. The semiconductor window layer 130 can be formed using any suitable thin-film deposition technique.

The semiconductor absorber layer 135 can be formed adjacent to the semiconductor window layer 130 and is preferably a p-type semiconductor material. The semiconductor absorber layer 135 can include a material such as, for example, cadmium telluride (CdTe), cadmium selenide, amorphous silicon (a-Si), copper indium (di)selenide (CIS), and copper indium gallium (di)selenide (CIGS). The semiconductor absorber layer 135 can be deposited using any suitable deposition technique. The semiconductor absorber layer 135 may have a thickness ranging from about $10^3$ Å to about $10^4$ Å (about 1 μm to about 10 μm) and, preferably, a thickness ranging from about $2\times10^3$ Å to $5\times10^3$ Å (2 μm to about 5 μm).

The back electrical contact layer 140 can include one or more highly conductive materials. For example, the back contact layer 140 can include molybdenum, aluminum, copper, silver, gold, or any combination thereof. The interlayer 145 may serve as an electrical insulator and a moisture barrier between the back contact layer 140 and the back cover 150 and may be deposited and heated by a lamination process.

Figure 4:
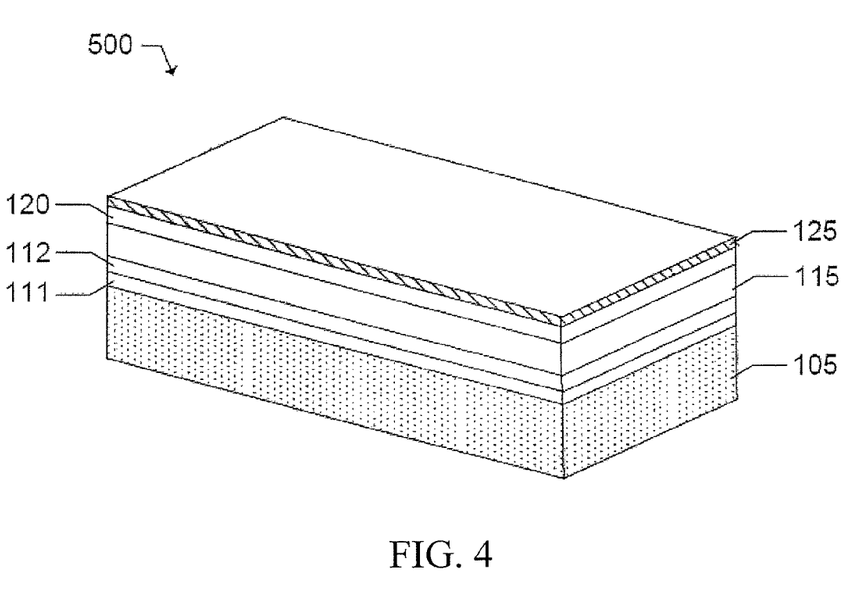
FIG. 4 is a perspective view of a prefabricated portion of a PV module.

The tunneling layer 125 (125a, 125b) can be formed during a PV module 100 manufacturing process where successive layers are applied to the substrate 105, which is typically a glass or other transparent material, until the PV module 100 is structurally complete. The PV module 100 can be fabricated beginning with either the substrate 105 or the back contact 140 with the other layers being formed thereover in sequence. Alternately, the tunneling layer 125 can be added during the preparation of a substrate that may be provided as a pre-fabricated unit to be used to produce a PV module 100, e.g., as shown in FIG. 4. FIG. 4 shows an example of a multilayer structure 500 having a tunneling layer 125 where, for example, a glass manufacturer may clean and prep a substrate 105, add the tunneling layer 125 after applying one or more barrier layers, e.g. 111, 112, adjacent to the substrate layer 105, a TCO layer 115 adjacent to the one or more of the barrier layers 111, 112, and a buffer layer 120 adjacent to the TCO layer 115. The tunneling layer 125 can be applied adjacent to the buffer layer 120. The multilayered structure 500 can then be provided as such a prepared unit to a PV device manufacturer who can further process the structure 500 by adding additional layers, e.g., semiconductor layers, 130, 135, back contact 140, interlayer 145, and back cover 150, as shown, for example, in FIG. 1, adjacent to the multilayered structure 500 to produce a functioning PV module 100.

Figure 5:
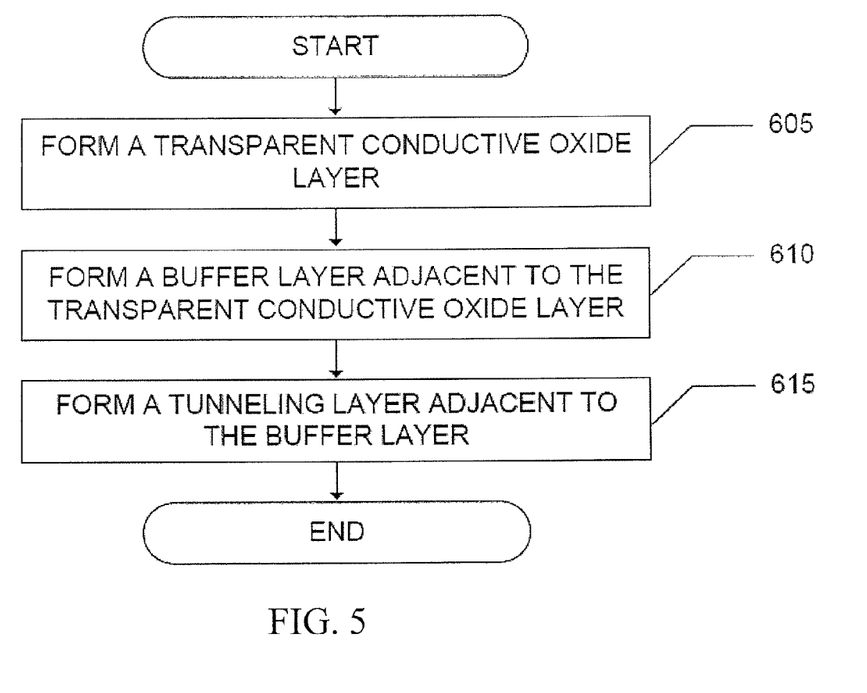
FIG. 5 is a flowchart, illustrating a method that may be used to manufacture a PV module.
Figure 6:
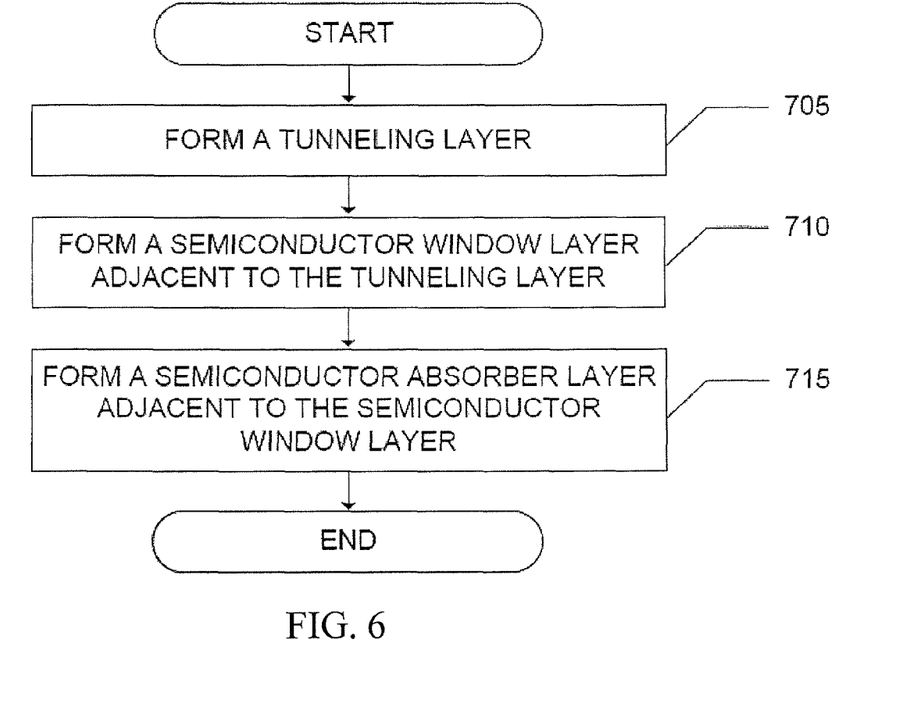
FIG. 6 is a flowchart, illustrating a method that may be used to manufacture a PV module.
Figure 7:
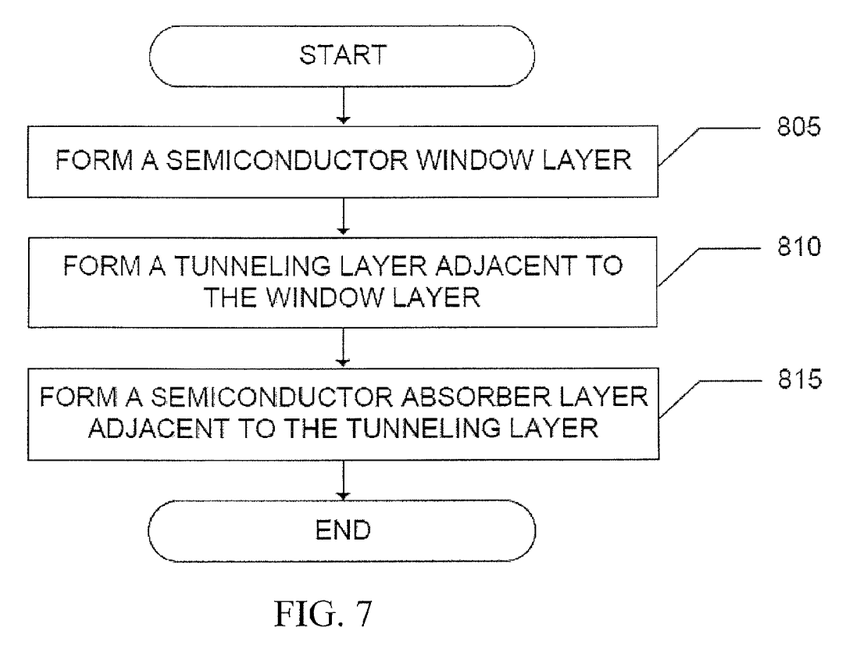
FIG. 7 is a flowchart, illustrating a method that may be used to manufacture a PV module.

Various methods may be used to form a tunneling layer 125 for a photovoltaic module 100 (e.g., FIGS. 1-3,8,9) or multilayered structure 500 (FIG. 4), non-limiting examples of which are described above. In one example, as shown in FIG. 5, a method for manufacturing a photovoltaic module 100 or multilayered structure 500 includes the following steps: (605) forming a TCO layer (e.g., 115); (610) forming a buffer layer (e.g., 120) adjacent to the TCO layer; and (615) forming a tunneling layer (e.g., 125) adjacent to the buffer layer. In another example, as shown in FIG. 6, a method for manufacturing a photovoltaic module 100 or multilayered structure 500 includes the following steps: (705) forming a tunneling layer (e.g., 125); (710) forming a window layer (e.g., 130) adjacent to the tunneling layer; and (715) forming an absorber layer (e.g., 135) adjacent to the window layer. In yet another example, as shown in FIG. 7, a method for manufacturing a photovoltaic module 100 or multilayered structure 500 includes the following steps: (805) forming a semiconductor window layer (e.g., 130); (810) forming a tunneling layer (e.g., 125) adjacent to the window layer; and (815) forming an absorber layer (e.g., 135) adjacent to the tunneling layer. Each of these method examples depicted in FIGS. 5-7 may also be used in combination with other method examples shown in FIGS. 5-7 to form structures as shown, for example, in FIGS. 1-4, 8, and 9.

Although the formation of the PV module 100 and/or multilayer structure 500 is/are described herein as occurring in a particular sequence or direction, for example, beginning with a substrate layer 105, forming layers, e.g., 110, 115, 120, 125, 130, 135, 140, in sequence adjacent to the substrate layer 105, and completing the module 100 with a back cover 150, this is not limiting. Formation of the module 100, for example, can be processed in a reverse sequence, beginning with a back cover 150 and forming layers, e.g., 140, 135, 130, 125, 120, 115, 110, in sequence over the back cover 150. A substrate layer 105 is then provided (in which case, it may be referred to as a superstrate). In addition, some layers illustrated may be omitted and the interlayer illustrated as 145 in FIGS. 1-3, 8, and 9 may be provided only on the sides of the other material layers and not between the back contact 140 and the back cover 150.

The term photovoltaic device may include any photovoltaic cell, collection of cells, module, device, or any portion or combination thereof. Also, each layer described herein may include more than one layer or film. Additionally, each layer can cover all or a portion of the device and/or all or a portion of the layer or substrate underlying the layer. For example, a "layer" can include any amount of any material that contacts all or a portion of a surface.

Additionally, any layer can be formed through any suitable deposition technique such as, for example, physical vapor deposition, atomic layer deposition or epitaxy, laser ablation, chemical vapor deposition, close-spaced sublimation, electro deposition, screen printing, sputtering (e.g., DC pulsed sputtering, RF sputtering, and AC sputtering), chemical bath deposition, or vapor transport deposition.

Details of one or more embodiments are set forth in the accompanying drawings and description above. Other features, objects, and advantages will be apparent from the description, drawings, and claims. Although a number of embodiments of the invention have been described, it will be understood that various modifications can be made without departing from the scope of the invention. Also, it should also be understood that the appended drawings are not necessarily to scale, presenting a somewhat simplified representation of various features and basic principles of the invention. The invention is not intended to be limited by any portion of the disclosure and is defined only by the appended claims.

What is claimed is:

1. A photovoltaic module structure, comprising:
an electrically conductive layer;
a first semiconductor layer;
a second semiconductor layer; and
a dielectric tunneling layer between the electrically conductive layer and the second semiconductor layer,
wherein the electrically conductive layer is a transparent conductive oxide layer and the dielectric tunneling layer is between the transparent conductive oxide layer and the first semiconductor layer or between the first semiconductor layer and the second semiconductor layer.

2. The structure of claim 1, wherein the dielectric tunneling layer is between the first semiconductor layer and the second semiconductor layer.

3. The structure of claim 1, wherein the dielectric tunneling layer is between the transparent conductive oxide layer and a buffer layer.

4. The structure of claim 1, further comprising a buffer layer, wherein the dielectric tunneling layer is between the first semiconductor layer and the buffer layer.

5. The structure of claim 1, wherein the dielectric tunneling layer is a first dielectric tunneling layer and the structure further comprises a second dielectric tunneling layer between the transparent conductive oxide layer and the second semiconductor layer.

6. The structure of claim 5, wherein the first dielectric tunneling layer is between the transparent conductive oxide layer and the first semiconductor layer and the second dielectric tunneling layer is between the first semiconductor layer and the second semiconductor layer.

7. The structure of claim 6, wherein the first dielectric tunneling layer is between a buffer layer and the first semiconductor layer.

8. The structure of claim 6, wherein the first dielectric tunneling layer is between the transparent conductive oxide layer and a buffer layer.

9. The structure of claim 1, further comprising at least one barrier layer between the transparent conductive oxide layer and a substrate.

10. The structure of claim 9, wherein the at least one barrier layer is about 100 Å to about 3000 Å thick.

11. The structure of claim 10, wherein the barrier layer comprises at least one of silicon oxide, silicon aluminum oxide, and tin oxide.

12. The structure of claim 4, further comprising a buffer layer that is about 50 Å to about 2000 Å thick.

13. The structure of claim 12, wherein the buffer layer comprises at least one of tin oxide, zinc oxide, indium oxide, and zinc tin oxide.

14. The structure of claim 1, wherein the dielectric tunneling layer is about 1 Å to about 300 Å thick.

15. The structure of claim 1, wherein the dielectric tunneling layer is about 5 Å to about 60 Å thick.

16. The structure of claim 1, wherein the dielectric tunneling layer comprises a material selected from the group consisting of silicon oxide, silicon nitride, silicon oxynitride, tantalum pentoxide, hafnium oxide, zirconium oxide, aluminum oxide, and combinations of these materials.

17. The structure of claim 1, wherein the transparent conductive oxide layer comprises at least one material selected from the group consisting of cadmium stannate, fluorine-doped tin oxide, cadmium stearate, cadmium tin, indium tin oxide, cadmium indium oxide, aluminum zinc oxide.

18. The structure of claim 1, wherein the transparent conductive oxide layer is about 500 Å to about 5000 Å thick.

19. The structure of claim 1, wherein the second semiconductor layer is a semiconductor absorber layer.

20. The structure of claim 19, wherein the semiconductor absorber layer comprises at least one of cadmium telluride and copper indium gallium (di)selenide.

21. The structure of claim 1, wherein the first semiconductor layer is a semiconductor window layer.

22. The structure of claim 21, wherein the semiconductor window layer comprises cadmium sulfide.

23. The structure of claim 22, wherein the semiconductor window layer is about 50 Å to about 1500 Å thick.

24. The structure of claim 22, wherein the semiconductor window layer is about 200 Å to about 1000 Å thick.

25. The structure of claim 1, further comprising a back contact layer proximate the second semiconductor layer.

26. The structure of claim 25, wherein the back contact layer comprises at least one of molybdenum, aluminum, copper, silver, and gold.

27. The structure of claim 1, wherein the dielectric tunneling layer is between the transparent conductive oxide layer and the first semiconductor layer.

* * * * *